(12) United States Patent
Moghaddam et al.

(10) Patent No.: US 6,888,721 B1
(45) Date of Patent: May 3, 2005

(54) ELECTROHYDRODYNAMIC (EHD) THIN FILM EVAPORATOR WITH SPLAYED ELECTRODES

(75) Inventors: Saeed Moghaddam, Columbia, MD (US); Michael M. Ohadi, Clarksville, MD (US)

(73) Assignee: Atec Corporation, College Park, MD (US)

( * ) Notice: Subject to any disclaimer, the term of this patent is extended or adjusted under 35 U.S.C. 154(b) by 0 days.

(21) Appl. No.: 10/683,338

(22) Filed: Oct. 10, 2003

Related U.S. Application Data

(60) Provisional application No. 60/419,690, filed on Oct. 18, 2002, and provisional application No. 60/419,649, filed on Oct. 18, 2002.

(51) Int. Cl.[7] .................................................. H05K 7/20
(52) U.S. Cl. ........................ 361/700; 257/714; 257/715; 174/15.1; 165/80.4
(58) Field of Search ................................ 361/699, 700; 257/714, 715; 174/15.1, 15.2; 165/80.4, 104.33

(56) References Cited

U.S. PATENT DOCUMENTS

| | | | |
|---|---|---|---|
| 6,437,981 B1 * | 8/2002 | Newton et al. ............. | 361/700 |
| 6,443,704 B1 | 9/2002 | Darabi et al. | |
| 6,601,643 B2 * | 8/2003 | Cho et al. .............. | 165/104.26 |
| 6,650,542 B1 * | 11/2003 | Chrysler et al. ............ | 361/699 |
| 6,741,469 B1 * | 5/2004 | Monfarad .................... | 361/700 |
| 2003/0062149 A1 * | 4/2003 | Goodson et al. ........ | 165/104.11 |

* cited by examiner

Primary Examiner—Boris Chervinsky
(74) Attorney, Agent, or Firm—Daniel Kramer

(57) ABSTRACT

Means for cooling a heated surface comprising an enclosure for enclosing the heated surface and two interleaved radial arrays of micro electrodes positioned on the surface within the enclosure thereby forming an interleaved radial array. The radial array has a 'near-vertex' end and a periphery. The micro electrodes at the near-vertex end have a smaller interelectrode distance and the micro electrodes at the periphery have a larger interelectrode distance. A volatile cooling liquid is contained within the enclosure and moved from the near-vertex array end toward the periphery along the lengths of micro electrodes by non-alternating voltages applied to the micro electrodes, thereby creating a polarization effect and evaporation of the volatile liquid.

14 Claims, 6 Drawing Sheets

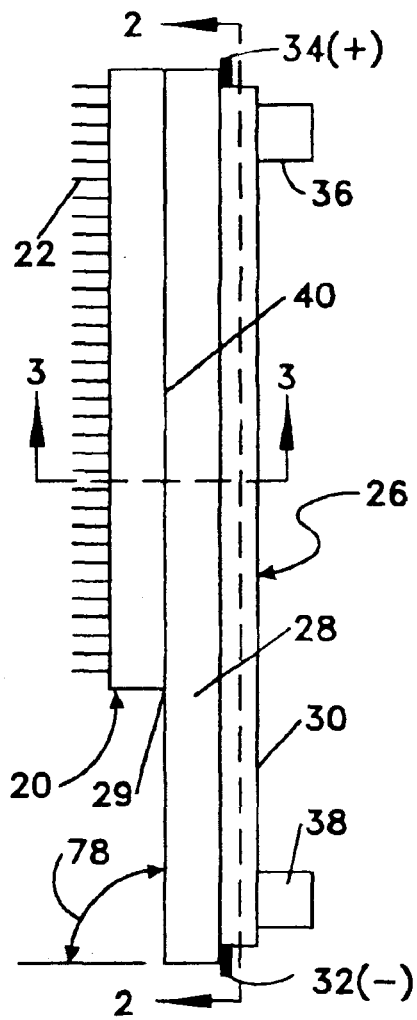
Fig. 1
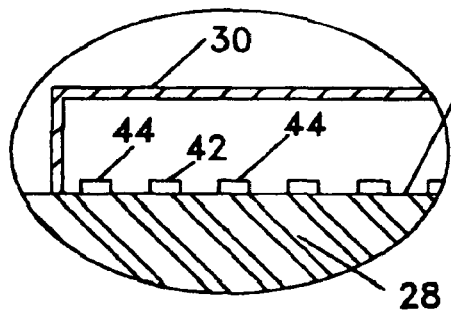
Fig. 3 SECTION 2A
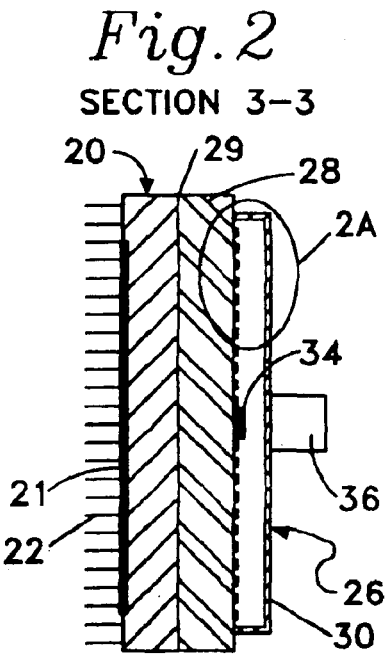
Fig. 2 SECTION 3-3
Fig. 4

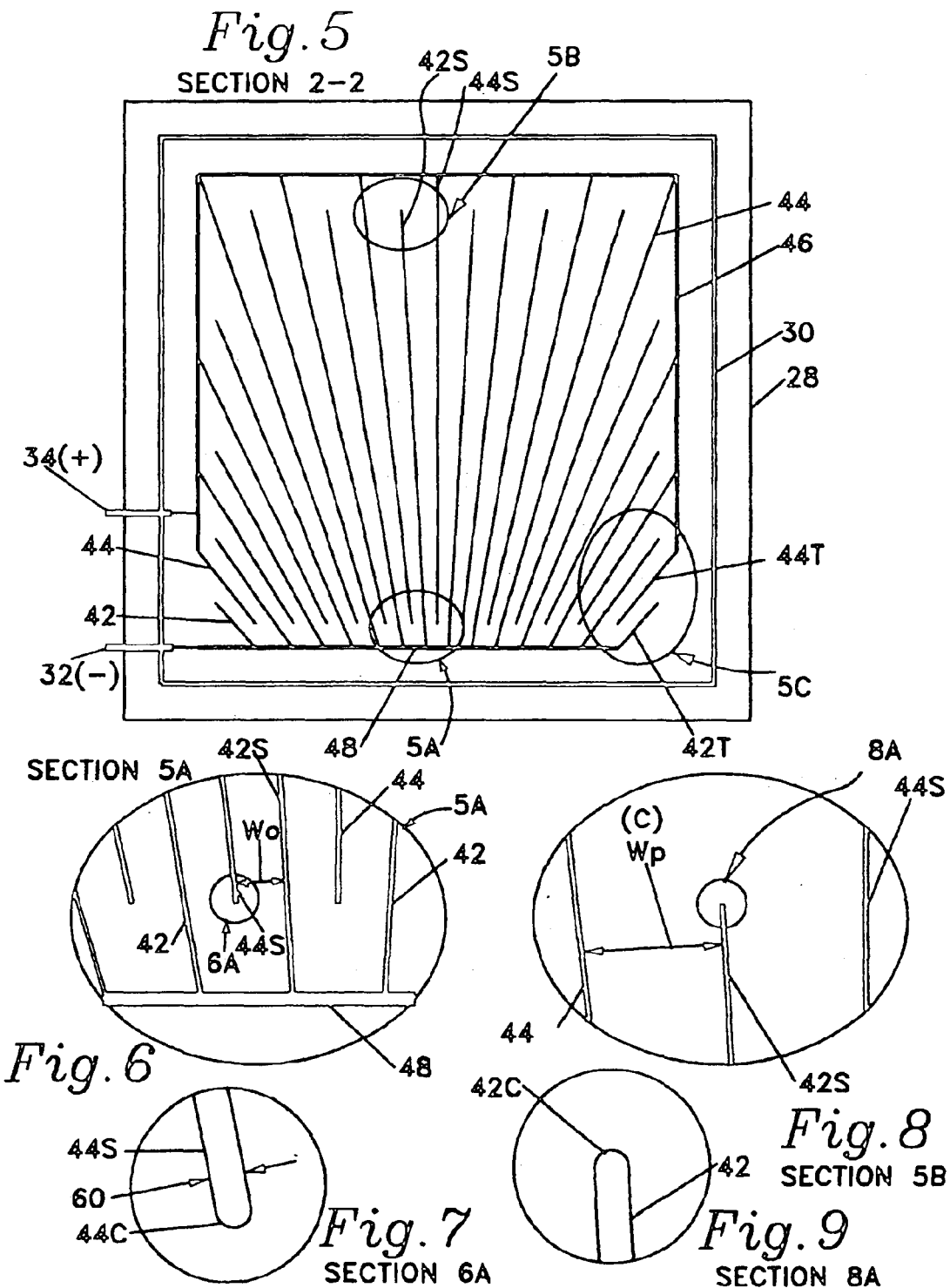

SECTION 14A-14A

ELECTROHYDRODYNAMIC (EHD) THIN FILM EVAPORATOR WITH SPLAYED ELECTRODES

PRIORITY CLAIMED

I. Priority is claimed based on the Provisional Patent Application filed 18 Oct. 2002 bearing Ser. No. 60/419,690 titled "Thin Film Evaporators Having Splayed Electrodes" and the Provisional Patent Application filed 18 Oct. 2002 bearing Ser. No. 60/419,649 titled "Thin Film Micro-Evaporators with Slit-Type Restrictor."

II. GOVERNMENT SUPPORTED RESEARCH

This invention was made with Federal support under grant DASG60-01-C-0077 awarded by the U.S. Army Space and Missile Defense Command. The Government has certain rights in the invention.

BACKGROUND

III. Integrated circuits (IC) utilize micro-components such as transistors, capacitors, and resistors that use and control electrical energy, frequently in digital form, for controllers and computers. Larger, macro-sized solid state components are employed as power controllers such as switches, rectifiers, and alternators. Neither the micronor the macro-sized components or conductors are 100 percent efficient. Specifically, the micro-digital assemblies (integrated circuits) used in computers convert most of the electrical energy used in their computations into heat.

IV. In the early versions of these integrated circuits, which had relatively few components per unit area, natural convection cooling proved adequate to maintain the operating temperatures at safe values. As technology allowed packing more components into an integrated package, the heat generated increased greatly, requiring motor driven fans to be mounted directly on the integrated circuit packages, thereby providing forced convection cooling, to control the package temperature. In order to accommodate higher and higher component densities and higher operating speeds requiring more and more power, more and more vigorous efforts have been made to remove heat effectively from the integrated circuit packages to maintain the operating temperatures of the integrated circuit at safe levels.

V. These efforts include more powerful fans, specialized venturis to direct the fan output onto the external surface of the integrated circuit package at higher velocities, plastic fins molded directly into the integrated circuit package and metal, and fins mounted on the package with heat conducting paste to better foster heat flow from the package to the fins to the fan forced air stream. All of these state of the art, commercially available, heat dissipation schemes have employed macro-cooling methods to cool micro-components.

VI. The increases in component density and accompanying heat dissipation rates have raised the operating temperatures of IC packages to such levels that, even with the best heat dissipating systems, their operating lives can be endangered. To cope with this problem, temperature sensing thermistors have been placed in the micro-circuits to reduce their performance and thereby their heat dissipation and temperature under high ambient conditions or when the heat dissipating mechanisms lose efficacy, as when fouled with room dust. These mechanisms keep the computer operating but at reduced capability. This reduction may be tolerable in household computing situations, but is intolerable in military or high heat flux commercial systems where human lives and great fortunes are at risk.

VII. The current invention is directed to means for sharply improving the coefficients of heat transfer between the integrated circuit package and the coolant by improving the flow rate of cooling fluid dispersed over the IC package in the form of ultra thin film (thickness could be from a few microns to as low as sub micron thickness) for evaporative cooling.

PRIOR ART

VIII. U.S. Pat. No. 6,443,704 issued 3 Sep. 2002 describes a micro-array of substantially parallel electrodes applied to a hot surface for the purpose of moving a volatile cooling fluid along the electrodes. FIGS. 9 and 10 disclose one set of alternating electrodes formed with linearly varying width over the electrode length. The operation of the array relating to these figures is described at col. 6 lines 63–68 and col. 7 lines 1–29. From the text it is clear that, first, the centerlines of the electrodes are all substantially parallel and, second, that the flow is intended to take place from the wide spacing, where the liquid coolant enters the array, to the narrow spacing, where the coolant is completely evaporated exactly the opposite of the flow direction required in the present invention.

IX. OBJECTS AND ADVANTAGES a. An object of the invention is to provide low cost, easily applied means for circulating, without moving parts, a volatile cooling fluid in heat transfer relation to a heated surface requiring cooling, whereby the liquid is evaporated.

b. A further object is to provide an array of interleaved micro-electrodes each having an electrical charge opposite the charge on its neighbors.

c. A further object is to position the array on the heated surface for the purpose of receiving liquid at a receiving or inlet end and moving the liquid from the receiving or inlet end over the length of the micro electrodes thereby covering the remainder of the array with a thin film of liquid, whereby the liquid in the film is evaporated over the area covered by the array, thereby cooling the heated surface.

d. A further object is to provide an interleaved array having electrodes positioned in a radial pattern.

e. A further object is to provide such an array having electrodes more closely spaced at the receiving or inlet end and more widely spaced at the other or periphery end.

f. A further object is to provide a non-alternating electrical charge having opposite polarities on adjacent electrodes.

g. A further object is to provide such means that require unusually small amounts of electrical power.

h. A further object is to provide such means employing micro-electrodes that can be applied to the heated surface itself.

I. A further object is to provide such means having radially positioned electrodes.

j. A further object is to provide such electrodes having connected ends and free ends and where the free ends have a rounded shape.

k. A further object is to provide such means having an integral condenser for rejecting heat from the vapor to a coolant thereby condensing the vapor to a liquid.

l. A further object is to provide such means that utilize fluid polarization or dielectrophoresis principles for moving the liquid coolant along the length of the electrodes.

m. A further object is to provide such means that require only direct current energization and do not require single or multi-phase alternating currents for electrode energization.

n. A further object is to provide such circulating or pumping means for a fluid that evaporates on contact with the surface being cooled.

o. A further object is to provide such circulating means that includes means for applying an electric field directly to the surface being cooled, thereby improving the heat transfer coefficient between the cooling fluid and the surface.

p. A further object is to provide an active thin film evaporation and cooling process.

q. A further object is to deploy the pumping means over the surface to be cooled.

r. A further object is to provide such circulating means to a surface positioned at any angle to the horizontal.

s. A further object is to employ a closed circulating system for the fluid circulated including a condenser for removing heat from the vapor produced by the evaporating process.

t. A still further object is to employ a volatile liquid as the fluid circulated and to deploy an externally cooled condenser to condense vapor generated at the cooled surface to the liquid state for reuse at the cooled surface.

u. A further object is to provide gravity circulating means for returning the condensed vapor to the surface.

v. A further object is to employ the principle of micro-electro-mechanical systems or MEMS to achieve the above objects.

w. Other equally important objects and objectives will be noted as the detailed exposition of the construction and usage of the invention is perused in the text below.

ADVANTAGES

X. The evaporator of this invention provides high evaporative heat transfer coefficients through the application of thin evaporating liquid films directly to the heated surface by depositing electrodes directly onto the heated surface thereby providing a high voltage gradient electric field directly to the heated surface.

XI. The splayed electrode arrangement allows the use of higher driving voltages without arcing, thereby providing improved pumping action that causes the volatile cooling fluid to flow over the heat transfer surface. Pumping action enables the liquid delivery over a larger surface and also delays dryout.

XII. The electrodes are formed with rounded ends, thereby reducing the local voltage gradients at the electrode ends to allow higher working voltages without arcing.

XIII. The volatile liquid path is directed first over the most closely spaced electrodes at the near origin of the radial or splayed electrodes thereby allowing higher voltages to be applied relying on the higher dielectric constant of liquids, compared to that of vapors.

XIV. The low breakdown voltage of vapor resulting from the evaporation of the cooling liquid is directed over the most widely spaced electrodes, thereby utilizing the wider electrode spacing to prevent arcing.

XV. The use of cooling by evaporation allows higher heat transfer coefficients at both the cooled surface using the electrodes of the invention and the condenser where the heat is rejected to a cooling fluid.

BRIEF SUMMARY OF THE INVENTION

XVI. A micro-evaporator surface having an inlet for entry of a cooling volatile liquid and an exit for discharge of vapor. The surface has positioned thereon a radial array of electrodes of substantially uniform width. The array has a near-vertex at which the electrodes are most closely spaced and a periphery at which the electrodes are most widely spaced. The most closely spaced electrodes at the near-vertex are positioned adjacent the liquid inlet. A non alternating electrical charge is applied so that each electrode has a charge opposite the adjacent electrode whereby dielectric fluid flows under dielectrophoresis force along the lengths of the electrodes from the near-vertex where the electrodes are most closely spaced to the periphery where the electrodes are furthest apart.

XVII. BRIEF DESCRIPTION OF THE DRAWINGS

FIG. 1 shows a side elevation of a heat producing integrated circuit package having the evaporator assembly of the invention mounted on the surface of the integrated circuit package in heat transfer relationship to it.

FIG. 2 is cross-sectional view 2 of the device in FIG. 1 illustrating the gross internal electrode layout of the pump-heat exchanger of the invention.

FIG. 3 is a further enlarged cross section of the device of FIG. 2 showing an end view of the evaporator exchanger with some of its electrodes.

FIG. 4 shows an elevation of the exchanger of the invention combined with a heat producing integrated circuit package.

FIG. 5 is a plan cross-sectional view of the evaporator assembly showing the splayed orientation of the electrodes.

FIG. 6 is a highly enlarged view of the electrode ends at the near-vertex.

FIG. 7 is a further enlargement of the electrodes of FIG. 6 illustrating an example of rounded electrode ends.

FIG. 8 is a highly enlarged detail 5B of the electrodes near the array periphery.

FIG. 9 is a further enlargement of the electrodes of FIG. 7 at section 6A showing an electrode having a rounded end.

DETAILED DESCRIPTION OF THE INVENTION

Figures 10, 11:
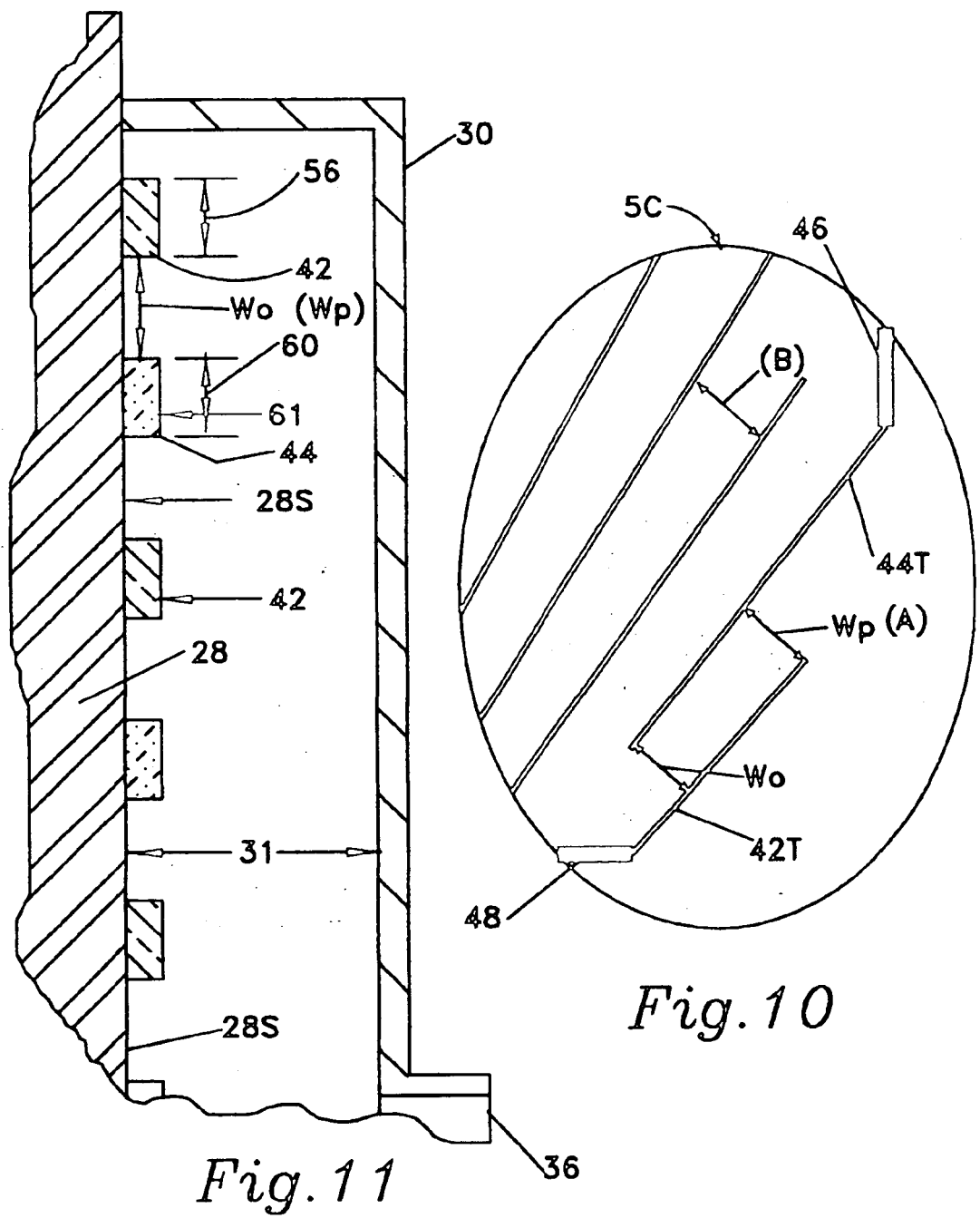
FIG. 10 shows an enlarged detail of section 5C of FIG. 5.
FIG. 11 is a very much enlarged cross-section of the section of FIG. 3 that shows approximate electrode dimensions and spacings.

Technical Background:
Fabrication:

XVIII. While a typical fabrication sequence is described, it is not intended that the described sequence be part of the invention and that any technology that applies electrodes will fulfill the requirements of the invention. Details and particulars of electrode positioning are described in connection with the figures.

XIX. Typical fabrication begins with wafer or substrate pre-metalization cleaning. The substrate is typically silicon with a layer of oxide or nitride or any other dielectric layer or coating. Other substrates such as quartz, sapphire, or other similar material may be employed. After cleansing, 300 Å thickness Chromium and 2500? Å thickness Platinum (1 ?Å=0.0001 m) is deposited using an e-beam evaporator. A 1.5 m thick layer of photo resist is applied over the deposited metals, then softly baked at 100° C. Photolithography is employed to create the desired electrode pattern followed by a hard-bake at 120° C. While Ion beam-milling was employed, a variety of other etching techniques such as wet etching and deep reactive ion etching are available.

XX. The Cr/Pt film is etched to give the heater and electrode patterns. Following the micro fabrication, the packaging is performed.

Cooling Fluid:

XXI. A preferred cooling fluid suitable for use in this invention that is highly subject to electrical polarization is a mixture of about 50 percent each of nonafluoroisobutylether and nonafluorobutylether offered by 3M Company located in St. Paul Minn. (1 800 364-3577) under the trade name HFE-7100. This fluid has a liquid dielectric constant k of about 7.4 and a vapor dielectric constant of about 1.0. Its boiling point at atmospheric pressure is about 60° C. (~140° F.) and it has a liquid viscosity of 0.23 CPS at 23° C. (73.4° F.). Among other useable fluids are those which have low electrical conductivity and liquid dielectric constants in the range of 2 to 100. Examples of these are deionized (DI) water (k=78.5), HFC-134a (k=9.5), L-13791 (k=7.39) and methoxynonafluorobutane (C4F9OCH3)[KMBl].

Principles of Operation:

XXII. While the following principles are believed to be those causing and governing the outstanding performance of the invention, these principles are not the essence of the invention. It should be understood the arrangement and shape of the micro-electrodes and their relationship to the flow of the cooling fluid and the design of the heat removal or condensing arrangements is of the essence of the invention as detailed in the claims.

XXIII. The application of high non-alternating direct current voltages to splayed or radial electrode arrangement provide an electric field that causes polarized pumping of a high dielectric constant volatile cooling fluid along the lengths of the electrodes from the electrode ends most closely spaced to the electrode ends most widely separated, whereby uniform liquid coverage of the electrode area and high boiling heat transfer coefficients are generated over the area to be cooled.

XXIV. The thin liquid layer is delivered over the heat transfer surface covered by the splayed electrodes using dielectrophoresis force. This force is generated through the use of non-uniform electric fields generated by the electrode arrangement. The thin liquid layer rises or moves along or between pairs of electrodes by dielectrophoresis force action upon the liquid dipoles. The liquid dipoles can either be permanent or formed in the nonuniform electric field.

XXV. A second force, electrostriction force, acts on the liquid-vapor interface thereby both holding the liquid securely against in the immediate vicinity of the electrodes.

XXVI. The rate of flow of the volatile cooling fluid depends on the magnitude of the two forces. Using splayed or radially positioned electrodes the electrostriction force is significantly decreased.

XXVII. Using these forces as applied by the electric potentials applied to the radial electrodes maintains a 1–2 micron thick liquid layer over a surface area covered by the radially positioned electrodes thereby establishing a superior heat removal mechanism.

XXVIII. A splay ratio or ratio of the widest distance between a pair of adjacent oppositely charged electrodes and closest distance between the same pair of electrodes of about three in HFE-7100, with a constant applied voltage has achieved as much as three times the pumping height as attainable with the uniformly spaced parallel electrode geometry.

XXIX. This pumping height increase is secured by increasing the threshold electric field breakdown voltage. The increase is provided in part by arranging the cooling fluid flow pattern so that the most closely spaced ends of the oppositely charged adjacent electrodes are immersed in the liquid. Since the breakdown threshold voltage of the dielectric coolant liquid is about an order of magnitude higher than gases, the electrode arrangement that allows the liquid to cover the closely spaced electrodes and vapor to mostly cover the widely spaced electrodes allows much higher voltages to be applied.

XXX. For instance, the breakdown fields of HFE-7100 liquid is about 11.2 kV/mm and of its vapor at atmospheric pressure is about 3 kV/mm. Consequently a higher voltage gradient can be applied between closely positioned adjacent electrode pairs immersed in liquid than similar electrodes immersed in the vapor. These more closely positioned electrode pairs are located at the near vertex of the radial electrode pattern which are immersed in liquid. Those higher voltages that are just tolerable without arcing when those electrodes are immersed in liquid also become tolerable without arcing when immersed in vapor when the electrodes in the vapor are spaced further apart, a structure provided by the radial array.

DETAILED DESCRIPTION OF THE DRAWINGS

XXXI. FIG. 1 is a side elevation of an Integrated Circuit Assembly 20 within which is located the Integrated Ciruit (IC) 21. IC Assembly 20 is formed in an enclosure 24 and has a multiplicity of electrically connecting pins 22 for providing power and information to the IC 21 from a computer connected socket and for withdrawing from the IC 21 information processed by it. In the process of performing its information or power processing function, heat is generated by the IC 21 sealed within the package 21 and heat produced flows to its external surface 40, positioned opposite its pins 22, thereby heating that surface 40.

XXXII. The cooling system assembly 26 of the invention is thermally connected to the hot surface 40 of the IC assembly or package 21. Typically the thermal connection is made by coating the surfaces to be thermally connected with a heat conducting grease and clamping or otherwise securing together (clamping means not shown) the IC package 20 to be cooled and the cooling device 26, thereby forming a mechanical and thermal interface 29.

XXXIII. The cooling unit 26 has a silicon substrate 28. Other materials may be employed for substrates including ceramic or single crystal quartz. The primary substrate requirements are low electrical conductivity, rigidity, and high thermal conductivity. On the surface 28S of the substrate 28 of the cooling unit 26 (FIG. 3) there are positioned a multiplicity of substantially linear or straight micro-electrodes 42, 44 (FIG. 3).

XXXIV. An enclosure 30 is provided for channeling cooling fluid over the micro-electrodes 42, 44. The enclosure 30 is bonded or otherwise sealed to the substrate 28S. The enclosure 30 is provided with a fluid inlet 38 and a fluid outlet 36.

XXXV. While the electrodes 42, 44 in the electrode array are described and shown as being straight, they can also be positioned on a curved or cylindrical surface and the description should be understood to apply to each surface to which such an array could be applied whether flat, curved, cylindrical, convex, or concave.

XXXVI. FIG. 1 displays two sectioning lines: 3—3 refers to a section shown in FIG. 2; 2—2 refers to sections shown in FIGS. 5, 6, 7 and 8.
FIG. 2:

XXXVII. Referring now to FIG. 2, which is section 3—3 of FIG. 1, there are displayed positioned on and fastened to the surface 28S of substrate 28 two separate arrays of micro-electrodes; the nominally negative array having tie bar 48 and having connected thereto a series of micro-elements 42, and the nominally positive array having tie bar 46 and having connected thereto a series of micro-elements 44. The micro-elements 42 and 44 are positioned in a radially interleaved fashion (FIG. 5) so that the micro-elements 42 alternate with the micro-elements 44. While the positive tie bar 46 and the negative tie bar 48 are positioned at opposite ends of the interleaved array, it is the clear intent of the inventors that the tie bars can be positioned wherever convenient, even at the same end of the interleaved array, laying one on top of the other and each insulated from the other.

XXXVIII. Referring again to FIG. 2 there is shown in cross section the IC package 20 containing IC 21 with heat transfer interface 29. The cooling assembly 26 is thermally connected to IC package 20 at thermal interface 29. Enclosure 30, substrate 28S on which the radial array is positioned, electrical lead 34 and vapor connection 36 are displayed.

XXXIX. The electrical potential needed to cause polarization of a preferred fluid depends in part on the nature of the fluid and in part on the separation distance of the micro-electrodes. While the breakdown potential for the vapor of the cooling fluid may be in the region of 3 kV/mm, the very small electrode spacing requires a voltage in the range of 50 to 200 V. While a uniform, substantially non-varying DC voltage performs well, it is within the scope of this disclosure that the voltage may be caused to vary while maintaining the same relative polarity between the electrodes. The voltage variation may be in the form of an impressed sine wave, a square wave, or some other format. Further, a variation having a defined frequency, such as 20 Hertz (Hz) or 60 Hz, or a much higher frequency, such as 1000 Hz, may be preferred.

XL. FIG. 3 is cross-section 3—3 of a portion of the structure of FIG. 2. FIG. 3 shows substrate 28 with micro-electrodes 42 and 44 positioned thereon. On the surface 28S of substrate 28 are positioned the individual micro-electrodes 42, 44. Enclosure 30 is shown. In FIG. 3 the scale is too small to clearly show details of the individual micro-electrodes, but a much enlarged section 3—3 is shown in FIG. 11 where electrode dimensions are disclosed and discussed.

XLI. In FIG. 4 there is shown a construction where a single substrate 50 provides a base for the micro-electrodes 42, 44 within flow enclosure 30. Optional fluid inlet 38 and outlet 36 are shown. Pins 22 are shown. These are to supply and retrieve power to and digital information from the IC kernel 21 as shown in more detail in FIG. 2. Pins 52 and 54 serve to supply the EMF required by the micro-electrodes 42, 44 positioned within flow enclosure 30. The micro-electrodes 42 and 44 are arranged in a radial array as shown in FIG. 5. The construction shown in FIG. 4 enables a single integrally designed and constructed package to perform both the computing and the heat transfer functions.

XLII. FIG. 5 is a cross-sectional view 2—2 of the construction of FIG. 1. FIG. 5 shows the radially interleaved micro-electrodes 42 and 44 positioned in an interleaved radial array on substrate 28 within the confines of the enclosure 30.

XLIII. The terms 'near-vertex' end of the array and 'periphery' of the array are defined as follows: the near-vertex end of the radial array is the area defined by the points of connection of electrodes 42 to negative bus 48 and the unconnected ends of electrodes 44. The periphery of the radial array is the area defined by the points of connection of positive micro-electrodes 44 to positive bus 46 and the unconnected ends of micro-electrodes 42.

XLIV. The positive bus 46 is powered by external connection 34(+) and the negative bus 48 is powered by external connection 32(−).

XLV. Continuing reference to FIG. 5, the width of the active substrate surface 28S, measured across the face of the radial array of micro-electrodes from the left hand vertical portion of bus 46 to the right hand vertical portion of bus 46 is about 32 millimeters (mm) and the height measured from the bus 48 to the horizontal portion of bus 46 is about 32 mm.

XLVI. There are three sectional areas identified on FIG. 5; 5A shown in FIG. 6 positioned at the near-vertex of the radial array enclosing central micro electrode 42 and adjacent micro-electrode 44; 5B shown in FIG. 8, is positioned at the periphery of the radial array enclosing the central micro-electrode 42 and its adjacent micro-electrode 44; and 5C shown in FIG. 10 positioned at the lower right-hand corner of the array.

XLVII. In FIG. 6 (Section 5A) there is shown very much enlarged the negative bus 48, the ends of specific micro-electrode 42S connected to bus 48 and the free or unconnected end of adjacent positive micro-electrode 44S. The distance Wo between the free end of micro-electrode 44S and the adjacent micro-electrode 42S is shown. The inter-electrode spacing Wo at the near-vertex end is about 20 microns. However, this spacing is dependent on the size of the array, the desired voltage, and the nature and characteristics of the volatile fluid. Section 6A identifies only the end of micro-electrode 44S. This area 6A is shown greatly enlarged as FIG. 7.

XLVIII. FIG. 8 is an enlarged section 5B from FIG. 5. There is shown a view of micro-electrode 42S and micro-electrode 44S, the other ends of the same electrodes shown and described in FIGS. 6 and 7. The spacing of these two micro-electrodes is shown as Wp, the spacing at the periphery. The inter-electrode spacing Wp at the periphery of the radial array is about 60 microns. Thus the ratio Wp/Wo is about 3. The exact value of the ratio depends on the size of the radial array, the nature of the fluid, and the intended non-alternating (DC) voltage to be applied between the micro-electrodes 42 and 44. The numerical value of the ratio Wp/Wo generally is between 1.5 and 5, though greater values of the ratio can be provided dependant on the break down voltages of the fluid in liquid phase and vapor phase.

XLIX. Depending on the radial angle between the micro-electrodes and their lengths, both the distances Wo and Wp can be selected and the ratio Wp/Wo can be established. Most volatile dielectric fluids exhibit much higher breakdown threshold in liquid phase compared to their dielectric constants in the vapor phase. The ratio between these liquid and vapor phase breakdown threshold is generally about ten to one. This means that the voltage between electrodes in a parallel (not radial) format as taught in U.S. Pat. No. 6,443,704, having liquid at one end and vapor at the other, must be limited by the inter-electrode distance at the vapor end. In a radial array, taught by this disclosure, a very much greater voltage can be applied between the electrodes since the ends surrounded by vapor are much further apart than the ends surrounded by liquid. While a ratio of electrode distances Wp/Wo of 3 is highly useful, the ratio should be varied as required by the size of the array, the applied voltages, and the nature and characteristics of the volatile fluid. Therefore while it is intended that Wp/Wo ratios would frequently be within the range of 1.5 to 5.0, even larger ratios should be applied to fit specific fluid characteristics as required.

L. Referring now to both FIGS. 7 and 9, these show greatly enlarged sections 6A from FIGS. 6 and 8A from FIG. 8. They identify micro-electrodes 44S and 42S and show both micro-electrodes formed with a rounded instead of the usual square ends. The outline of the rounded ends is a semicircle having a radius one half the width 60 of the micro-electrodes. Typically, all the interleaved micro-electrodes 42 and 44 in the radial array have substantially the same width 60 of about 10 microns and a thickness 61 (FIG. 11) of about 0.3 micron.

LI. FIG. 10 is a greatly enlarged section 5C from FIG. 5. In FIG. 10 there is shown a small portion of negative bus 48 and attached micro-electrode 42T and, connected to positive bus 46, micro-electrode 44T. The distance Wo between the two micro-electrodes at their near-vertex position has the same approximate value as Wo of section 5A in FIG. 6 and the distance Wp between the two micro-electrodes at their periphery has approximately the same value as the value of Wp shown in section 5B at FIG. 8. Therefore the ratios Wp/Wo of the inter-electrode distances of the two pairs of micro-electrodes are substantially the same. However, the angle A between the two short electrodes 42T and 44T is much greater than the angle C between the two long electrodes 42S and 44S. The angle B of the two micro-electrodes 42 and 44 that are between the micro-electrodes 42T/44T and the more central ones 42S and 44S has a value between the values of angle A and angle B.

LII. Examining now FIG. 11 there is shown a greatly enlarged cross section of a portion of the interleaved radial array of micro-electrodes 42, 44 at the near-vertex. These are positioned on surface 28S of substrate 28 and are enclosed by flow enclosure 30 with one of its connections 36. The wall 30 of the flow enclosure that is parallel to the surface 28S typically is spaced a distance 31 from the substrate and the micro electrodes. Distance 31 is typically about 3 mm, although, for different fluids and requirements, other dimensions 31 can be employed.

LIII. In one preferred embodiment, micro-electrodes 42 and 44 each have a width dimension 56, 60 of 10 microns and a thickness 43, 61 of 0.3 micron. In their interleaved radial array the spacing between the micro-electrodes naturally depends on the distance from the near-vertex. At the near-vertex, the inter-electrode spacing Wo is about 20 microns and at the periphery the spacing Wp between adjacent microelectrodes is about 60 microns. In other embodiments, adapted for different heat transfer rates or different cooling fluids, or different applied voltages, other dimensions may be preferred. In one preferred embodiment the micro-electrodes are formed of copper, in others Gold or Platinum are employed. In still other embodiments, Niobium or a Niobium rich alloy is employed for the micro-electrodes. The choice of micro-electrode material depends greatly on the kind of fluid employed since the material must not react with, dissolve, or be corroded by the fluid.

Figure 12:
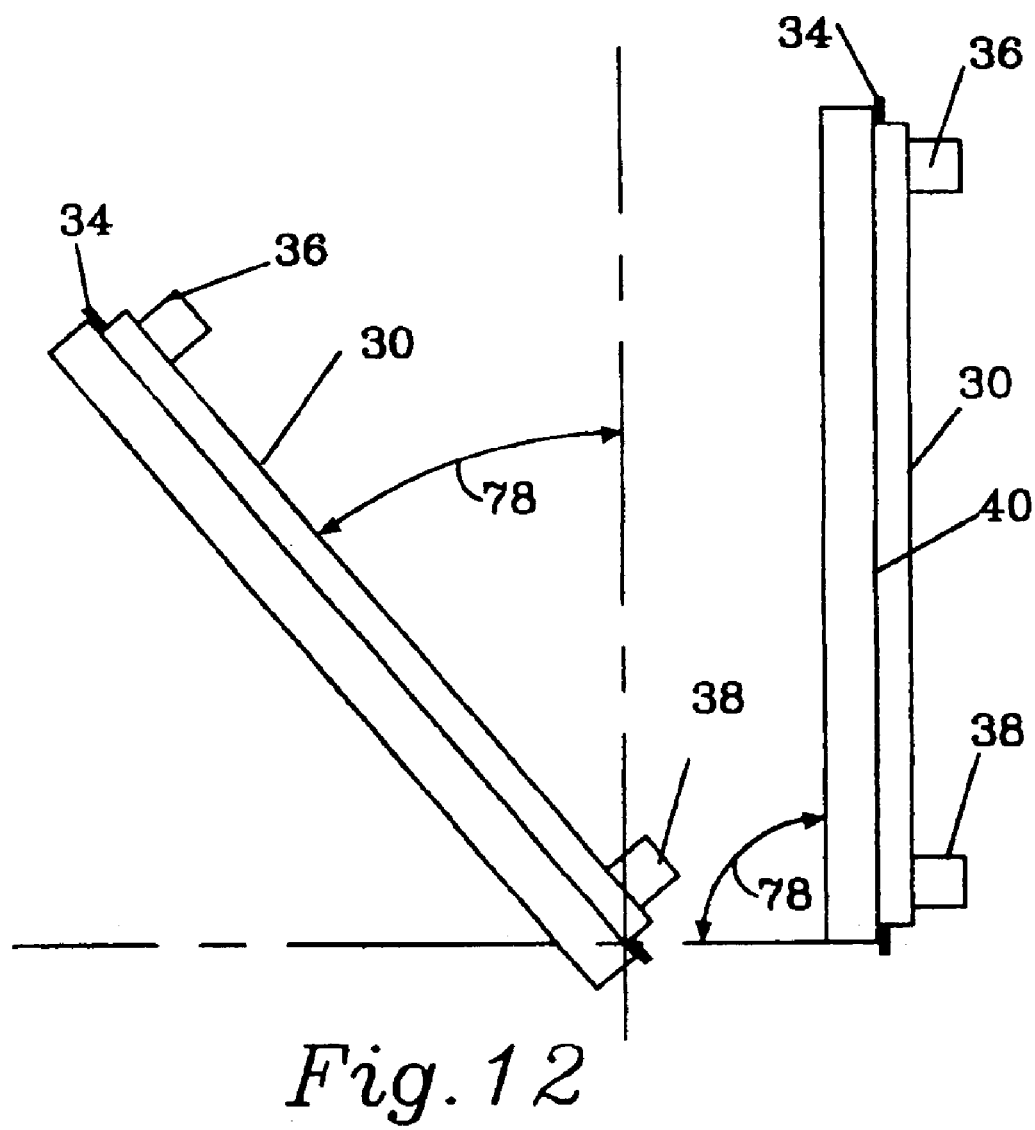
FIG. 12 is a side elevation of an integrated circuit and an associated evaporator of the invention positioned at various angles to the vertical.

LIV. In FIG. 12 the substrate surface 28S bearing the micro-electrodes of the invention is so positioned that its plane and therefore the position of the near-vertex end of the radial array is at a position such that entering volatile liquid coolant will enter and substantially cover the near-vertex end of the radial array. While the pumping action on the cooling fluid that enters inlet 38 is effective without reference to the electrode direction, the philosophy of the invention requires a supply of liquid volatile coolant to be supplied to the near-vertex end of the radial array to ensure the closely spaced electrodes are covered with liquid so that the closely spaced electrodes do not arc. A preferred maximum deviation of the angle 78 between the substrate surface 28S and the vertical is about 75 degrees to best ensure that liquid entering the enclosure is initially concentrated at the near-vertex position.

Figure 13:
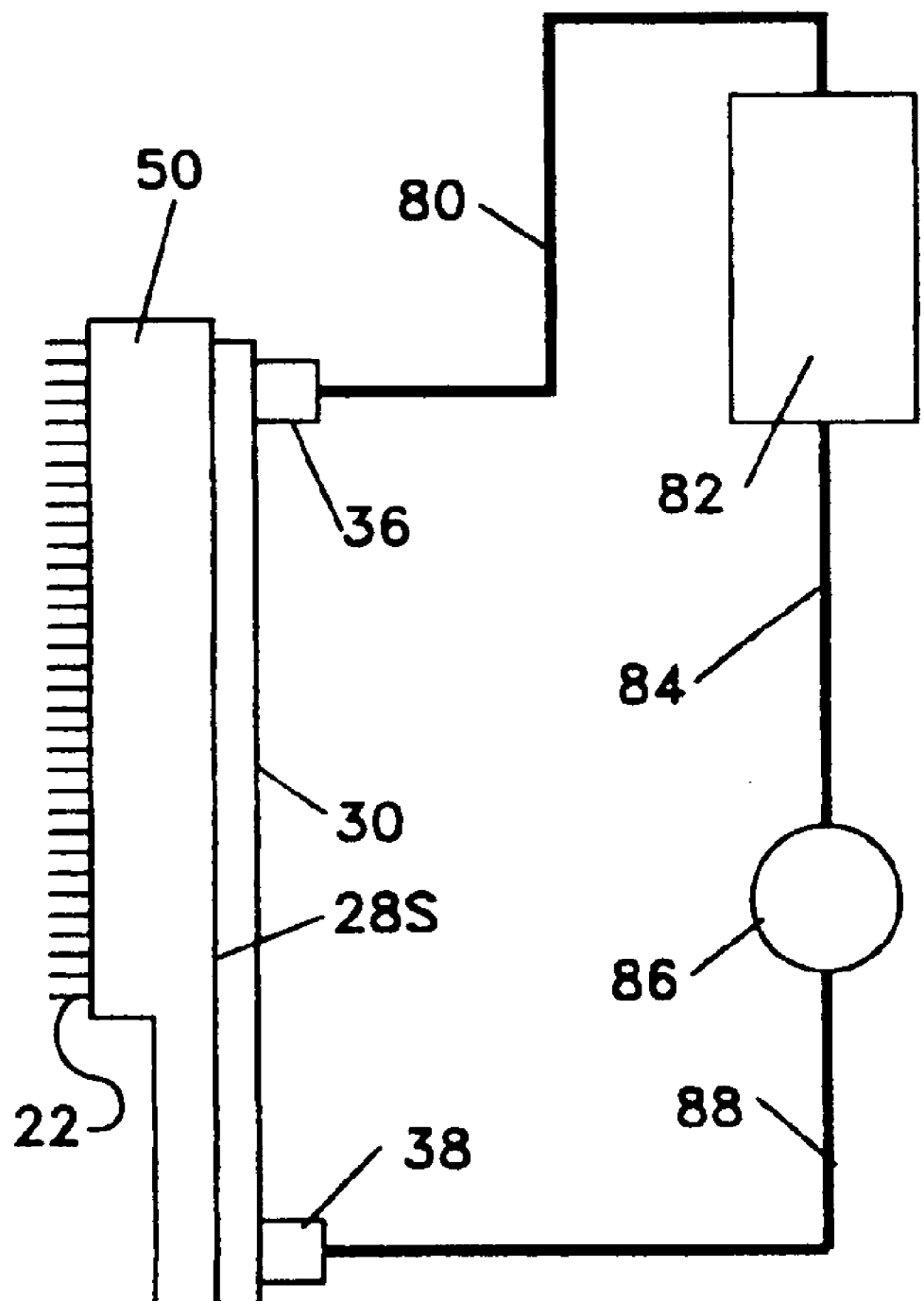
FIG. 13 is a schematic representation of a fluid circuit for transporting vapor produced by the evaporator of the invention to an external condenser.

LV. Referring now to FIG. 13, an elevational view of the invention shown in FIG. 4 which has therein the radial interleaved array of micro-electrodes with the near-vertex of the array (FIG. 5) positioned near the bottom of the assembly adjacent the liquid inlet 38 to the enclosure cover 30 is shown. At the upper end of enclosure cover 30 is positioned vapor outlet 36. A vapor conduit 80 serves to convey vapor, produced by the radial array during the cooling process, to external condenser 82. The vapor is condensed to a liquid in condenser 82 and flows by gravity through conduits 84 and 88 back to liquid inlet 38. In some cases, a pump 86 may be necessary to overcome gravity or frictional flow resistance in the conduits.

Figure 14:
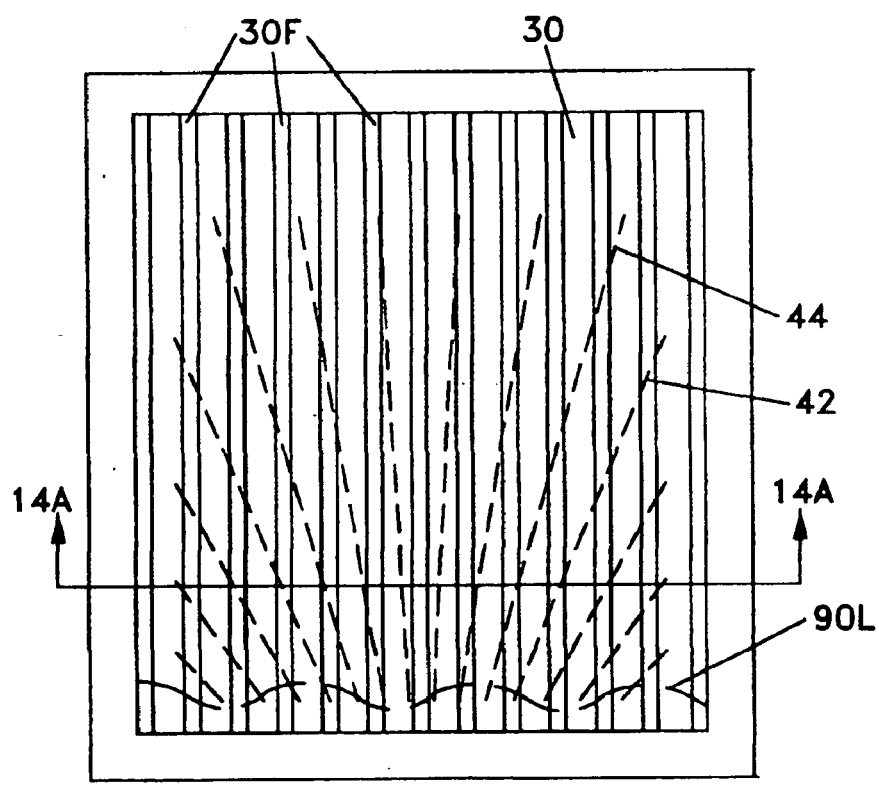
FIG. 14 shows such an evaporator of the invention with an integrated fluid circuit having hollow fins.

LVI. FIG. 14 shows a front elevation of the exterior of the assembly 20 from the side of cover 30 of the radial micro-electrode array. Alternating radially positioned micro-electrodes 42 and 44 are shown hidden. Hollow fins 30F are formed in the cover 30. A pool of volatile liquid coolant 90 collects by gravity around the near-vertex area of the radial array thereby providing a liquid source for the array to pump along the length of its electrodes 42 and 44 and absorb heat from the integrated circuit 21 (FIG. 15) thereby evaporating. In order to prevent the pressure from rising significantly within enclosure 26, it is necessary to provide means for removing heat from the vapor, thereby causing it to condense. While the structure taught in FIG. 13 requires an external condenser, the structure provided here employs a condenser that is integral to the enclosure 26 and its cover 30. Hollow fins 30F have been formed in cover 30 for the purpose of providing extended surface to improve heat transfer from the vapor within enclosure 26 to some external coolant such as air. Section line 15—15 is shown.

Figure 15:
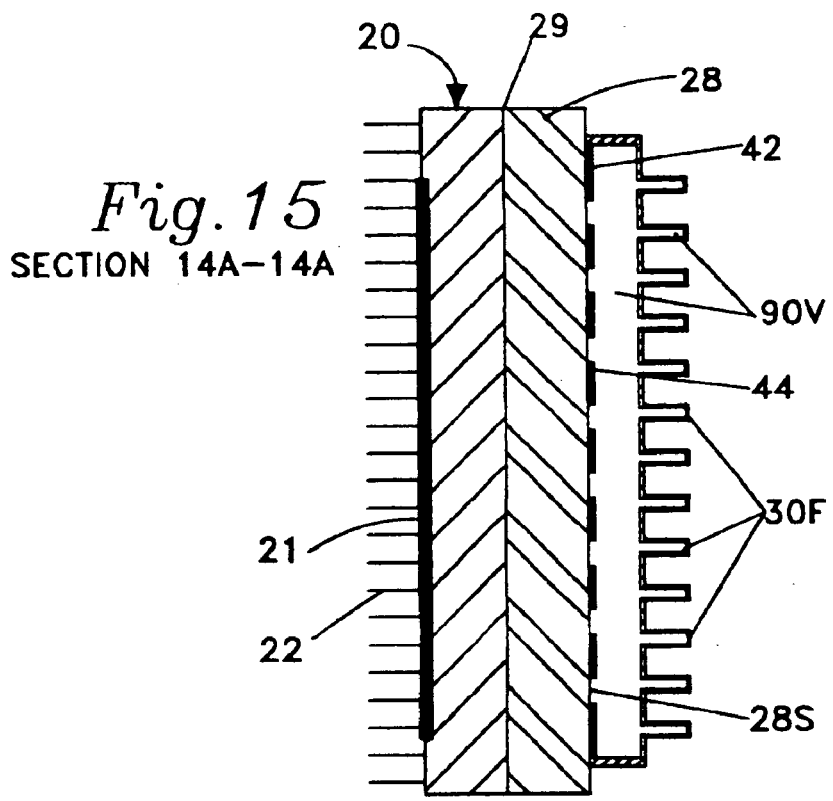
FIG. 15 is cross-section 15—15 of the construction of FIG. 14.

LVII. FIG. 15 is the cross-section 14—14 of FIG. 14. There is shown connecting pins 22 for supplying power to and interchanging information with heat producing integrated circuit 21 that is part of integrated circuit assembly 20. Substrate 28 is mounted in heat transfer mode with integrated circuit assembly 20 and has mounted to its surface 28S the radial interleaved array 42, 44 of the invention. The array 42, 44 and the volatile liquid 90L is enclosed within an enclosure 30 having hollow fins 30F. The interior of enclosure 30 is subject to vapor 90V formed by the evaporation of volatile liquid 90L sealed within enclosure 30 for cooling of the assembly 20. The extended surface provided by fins 30F effectively transfers heat from the fins 30F to the surrounding coolant, such as air, thereby removing heat from the coolant vapor 90V causing it to condense back to liquid 90L and drain down to the position at the near-vertex of the radial array shown in FIG. 14 whereby the process is repeated so long as the integrated circuit is energized and produces heat.

LVIII. From the foregoing description, it can be seen that the present invention comprises an advanced method for cooling integrated and other compact heat producing devices. It will be appreciated by those skilled in the art that changes could be made to the embodiments described in the foregoing description without departing from the broad inventive concept thereof. It is understood, therefore, that this invention is not limited to the particular embodiment or embodiments disclosed, but is intended to cover all modifications and elements thereof and their equivalents which are within the scope and spirit of the invention as described above and claimed.

We claim:

1. Means for cooling a surface, said cooling means comprising a surface and first and second radial arrays of substantially linear microelectrodes positioned on the surface, said first array having its micro-electrodes positioned between and alternating with the micro-electrodes of the second array, thereby forming an interleaved radial array having a near-vertex end having a first interelectrode distance and a peripheral end having a second interelectrode distance, the first interelectrode distance being smaller than the second interelectrode distance.

2. Cooling means as recited in claim 1, further providing a cooling fluid at least partly in contact with the micro-electrodes and further including means for applying a non-reversing electromotive potential between the first and second arrays for creating a polarization effect on the fluid, the first array thereby having a positive electrical potential with respect to the second array and the second array having a negative electrical potential with respect to the first array, whereby fluid is caused to flow radially along the lines of the micro-electrode array from the near-vertex end toward the periphery end, and enclosing means for channeling fluid flow along the micro-electrodes from the near-vertex end to the periphery end.

3. Cooling means as recited in claim 2, further providing that the ratio of the second interelectrode distance to the first interelectrode distance is between 1.5 and 5.

4. Cooling means as recited in claim 2, further providing that the ratio of the second interelectrode distance to the first interelectrode distance is between 2 and 4.

5. Cooling means as recited in claim 4 further providing that the cooling fluid evaporates in contact with the surface thereby forming a vapor and further providing means for condensing the vapor to a liquid and returning said liquid to the near-vertex end of the radial array.

6. Cooling means for a surface as recited in claim 5, further providing that the enclosing means includes a liquid inlet and a vapor outlet and that the means for condensing the vapor includes means for receiving said vapor from the enclosing means and means for returning said liquid to the enclosing means.

7. Cooling means as recited in claim 5, further providing that the condensing means is integral with the enclosing means.

8. Cooling means as recited in claim 7, where the integral condensing means is in the form of hollow protrusions in the enclosing means.

9. Cooling means as recited in claim 8, further providing that the hollow protrusions are linear hollow fins.

10. Cooling means as recited in claim 5 further providing a heat source and that said surface is integral with the heat source.

11. Cooling means as recited in claim 5 further providing a heat source and that said surface is separate from but thermally connected to said heat source.

12. Cooling means as recited in claim 2, further providing that each micro-electrode includes a connected end and a free end and further providing that the free end of each micro electrode positioned near the periphery end of the radial matrix has a substantially rounded profile.

13. Cooling means as recited in claim 2 further providing that each micro electrode has a connected end and a free end and that the free end of each micro-electrode positioned near the near-vertex end of the radial matrix has a substantially rounded profile.

14. Cooling means as recited in claim 2, further providing that the ratio of the first interelectrode distance to the second interelectrode distance is dependent on the ratio between the breakdown voltage of the cooling fluid in its liquid phase and the breakdown voltage of the cooling fluid it its vapor phase.

* * * * *